(12) United States Patent
Walsh et al.

(10) Patent No.: US 8,879,750 B2
(45) Date of Patent: Nov. 4, 2014

(54) ADAPTIVE DYNAMIC RANGE ENHANCEMENT OF AUDIO RECORDINGS

(75) Inventors: Martin Walsh, Scotts Valley, CA (US); Edward Stein, Capitola, CA (US); Jean-Marc Jot, Aptos, CA (US)

(73) Assignee: DTS, Inc., Calabasas, CA (US)

( * ) Notice: Subject to any disclaimer, the term of this patent is extended or adjusted under 35 U.S.C. 154(b) by 450 days.

(21) Appl. No.: 12/901,330

(22) Filed: Oct. 8, 2010

(65) Prior Publication Data
US 2011/0085677 A1 Apr. 14, 2011

Related U.S. Application Data

(60) Provisional application No. 61/250,320, filed on Oct. 9, 2009, provisional application No. 61/381,860, filed on Sep. 10, 2010.

(51) Int. Cl.
| H03G 7/00 | (2006.01) |
| H03G 5/00 | (2006.01) |
| H03G 9/18 | (2006.01) |
| H03G 9/00 | (2006.01) |
| H03G 9/02 | (2006.01) |

(52) U.S. Cl.
CPC ............... *H03G 9/18* (2013.01); *H03G 9/005* (2013.01); *H03G 9/025* (2013.01)
USPC .......................................... 381/103; 381/106

(58) Field of Classification Search
CPC ........... H03G 3/001; H03G 3/00; H03G 3/04; H03G 3/3005; H03G 5/005
USPC ......... 381/98, 101–104, 106, 107, 56, 58, 59; 700/94
See application file for complete search history.

(56) References Cited

U.S. PATENT DOCUMENTS

| 3,978,423 | A | 8/1976 | Bench |
| 4,811,404 | A | 3/1989 | Vilmur |
| 7,353,169 | B1 | 4/2008 | Goodwin et al. |
| 2007/0258603 | A1 | 11/2007 | Avendano et al. |
| 2007/0270988 | A1 | 11/2007 | Goldstein |
| 2009/0147975 | A1 | 6/2009 | Horbach |

OTHER PUBLICATIONS

International Search Report and Written Opinion Issued in Corresponding International Application No. PCT/US2010/052088; Filed Oct. 8, 2010.
International Preliminary Report on Patentability Dated Dec. 23, 2011; Issued in corresponding International Application No. PCT/US2010/052088; Filed Oct. 8, 2010.

(Continued)

*Primary Examiner* — Ping Lee
(74) *Attorney, Agent, or Firm* — William Johnson; Blake Welcher; Craig Fischer

(57) ABSTRACT

There are provided methods and an apparatus for conditioning an audio signal. According to one aspect of the present invention there is included a method for conditioning an audio signal having the steps of: receiving at least one audio signal, each audio signal having at least one channel, each channel being segmented into a plurality of frames over a series of time; calculating at least one measure of dynamic excursion of the audio signal for a plurality of successive segments of time; filtering the audio signal into a plurality of subbands, each frame being represented by at least one subband; deriving a dynamic gain factor from the successive segments of time; analyzing at least one subband of the frame to determine if a transient exists in the frame; and applying the dynamic gain factor to each frame having a transient.

14 Claims, 4 Drawing Sheets

(56) References Cited

OTHER PUBLICATIONS

First Office Action in corresponding Chinese Application No. 201080053361.2, dated Dec. 19, 2013.
Extended Search Report, dated May 6, 2014, issued in corresponding European Patent Application No. 10822801.6-1233, filed Oct. 8, 2010.
Michael Goodwin and Carlos Avendano, "Enhancement of Audio Signals Using Transient Detection and Modification," Audio Engineering Society Convention Paper 6255, Oct. 28-31, 2004, San Franciso, CA, USA.
Xavier Rodet and Florent Jaillet, "Detection and modeling of fast attack transients," Proceedings of the International Computer Music Conference, Sep. 18-22, 2001, MPublishing, University of Michigan Library, Ann Arbor, MI, U.S.
Katz, Bob, "Mastering Audio the art and the science, Second Edition," Oct. 3, 2007, Chapter 14, pp. 167-192, Focal Press, Great Britain.

ADAPTIVE DYNAMIC RANGE ENHANCEMENT OF AUDIO RECORDINGS

CROSS-REFERENCE TO RELATED APPLICATIONS

The present invention claims priority of U.S. Provisional Patent Application Ser. No. 61/250,320 filed Oct. 9, 2009, titled ADAPTIVE DYNAMIC RANGE ENHANCEMENT OF AUDIO RECORDINGS, to inventors Walsh et al.; and U.S. Provisional Patent Application Ser. No. 61/381,860 filed Sep. 10, 2010, titled ADAPTIVE DYNAMIC RANGE ENHANCEMENT, to inventors Walsh et al. U.S. Provisional Patent Application Ser. Nos. 61/217,562 and 61/381,860 are hereby incorporated herein by reference.

STATEMENT RE: FEDERALLY SPONSORED RESEARCH/DEVELOPMENT

Not Applicable

BACKGROUND

1. Technical Field

The present invention generally relates to audio signal processing, more particularly, to enhancing audio streams and recordings by restoring or accentuating their dynamic range.

2. Description of the Related Art

Following the adage that 'louder is better', it has become common practice in the recording industry to master and release recordings with higher levels of loudness. With the advent of digital media formats such as CDs, music was encoded with a maximum peak level defined by the number of bits that can be used to represent the encoded signal. Once the maximum amplitude of a CD is reached, the perception of loudness can be increased still further through signal processing techniques such as multiband dynamic range compression, peak limiting and equalization. Using such digital master tools, sound engineers can maximize the average signal level by compressing transient peaks (such as drum hits) and increasing the gain of the resulting signal. Extreme uses of dynamic range compression can introduce clipping and other audible distortion to the waveform of the recording. Modern albums that use such extreme dynamic range compression therefore sacrifice quality of musical reproduction to loudness. The practice of increasing music releases' loudness to match competing releases can have two effects. Since there is a maximum loudness level available to recording (as opposed to playback, in which the loudness is limited by the playback speakers and amplifiers), boosting the overall loudness of a song or track eventually creates a piece that is maximally and uniformly loud from beginning to end. This creates music with a small dynamic range (i.e., little difference between loud and quiet sections), oftentimes such an effect is viewed as fatiguing and void of the artist's creative expression.

The other possible effect is distortion. In the digital realm, this is usually referred to as clipping. Digital media cannot output signals higher than the digital full scale, so whenever the peak of a signal is pushed past this point, it results in the wave form becoming clipped. When this occurs, it can sometimes produce an audible click. However, certain sounds like drum hits will reach their peak for only a very short time, and if that peak is much louder than the rest of the signal, this click will not be heard. In many cases, the peaks of drum hits are clipped but this is not detected by the casual listener.

FIGS. 1a and 1b provide a visual representation of deleterious mastering techniques. The audio recording waveforms depicted in FIGS. 1a and 1b represent an originally mastered track and a version of the same track that has been mastered using different techniques. FIG. 1a represents the original recording, the presence of numerous peaks indicates a high dynamic range that is representative of the kinds of dynamics present in the original performance. This recording provides for a vibrant listening experience as certain percussive notes, such as drum hits, will sound punchy and clear. In contrast, the recording depicted in FIG. 1b is remastered for a louder commercial CD release. Most of the peaks present in the original recording are compressed or even clipped, and the dynamic range of the recording has been compromised as a result. This increasingly aggressive use of dynamic range compression at the mastering stage of commercial music has spawned much backlash from consumers, producers and artists.

Approaches discussed in the audio industry for addressing this issue concentrate on questioning the mastering techniques that are at the origin of the issue. One such example is described in Bob Katz. *Mastering Audio, Second Edition: The Art and the Science*. Katz describes how recordings can be mastered for loudness without distorting the final result using calibrated monitoring of the processing signal and using more moderate compression parameters. While most mastering engineers would concur with Katz's approach is often superseded by demands of the studio management. Even if more conservative mastering techniques do become the new norm, it does not resolve the problem for the body of existing recordings already mastered and distributed to end-users.

Existing processing techniques for modifying the dynamics of an audio recording are known in the art. One such process is loudness leveling where differences between the perceived loudness of audio materials, which have been subjected to varying degrees of dynamic range compression, are normalized to some predetermined level. However, these approaches are used to normalize the average loudness of consecutive tracks played from various sources and do not make any attempt to restore the dynamic range of overly dynamic range compressed content. As a result, compressed media can sound even more devoid of dynamic expression when played at lower prescribed listening levels.

Another known technique is applying an upward expander as described in U.S. Pat. No. 3,978,423 issued to Bench, titled Dynamic Expander. An upward expander, applies a time-varying gain to the audio signal according to a fixed 'expansion curve' whereby the output signal level is greater than the input level above a selected threshold. As a result, the amplitude of the louder portions of the source signal is increased. However, this can result in originally dynamic soundtracks having overemphasized transients in the output signal.

Another known technique is dynamic spectral equalization, where lower and higher frequency bands are boosted when transients are detected. As a result, a more dynamic output is yielded. Dynamic spectral equalization is described in X Rodet, F Jaillet, *Detection and Modeling of Fast Attack Transients* (2001), Proceedings of the International Computer Music Conference; U.S. Pat. No. 7,353,169 issued to Goodwin et al, titled Transient Detection and Modification in Audio Signals; and U.S. patent application Ser. No. 11/744,465 issued to Avendano et. al., titled Method for Enhancing Audio Signals. Unlike the previous approaches, these dynamic enhancement techniques exclusively affect signal transients. However, it affects all signal transients, even those that already exhibit high dynamics. Dynamic spectral equalization generally applies processing to all audio signal content, whether or not it is needed. This can result in an overly dynamic processed output for certain types of audio content U.S. Pat. No. 6,453,282, issued to Hilpert et al. outlines a method of transience detection in the discrete-time audio domain. Such time-domain methods are less reliable when analyzing heavily dynamic range compressed material as changes in energy due to transients becoming less apparent when looking at the signal as a whole. This leads to the misclassification of transient signals and results in yielding false positives.

In view of the ever increasing interest to improve the rendering of audio recordings, there is a need in the art for improved audio processing.

BRIEF SUMMARY

In accordance with the present invention, there are provided methods and an apparatus for conditioning an audio signal. The present invention provides a compelling enhancement to the dynamic range of audio signals, particularly for audio signals that have been subjected to deleterious mastering techniques.

According to one aspect of the present invention there is included a method for conditioning an audio signal having the steps of: receiving at least one audio signal, each audio signal having at least one channel, each channel being segmented into a plurality of frames over a series of time; calculating at least one measure of dynamic excursion of the audio signal for a plurality of successive segments of time; filtering the audio signal into a plurality of subbands, each frame being represented by at least one subband; deriving a dynamic gain factor from the successive segments of time; analyzing at least one subband of the frame to determine if a transient exists in the frame; and applying the dynamic gain factor to each frame having a transient.

The measure of dynamic excursion may be represented by the crest factor for a segment of time. A crest factor for each successive segment of time may be calculated by taking ratios of functions of peak signal magnitudes to functions of average signal magnitudes of the audio signal within the frame. The method may further include the step of calculating a subband relative energy function for at least one subband.

An overall subband transient energy may be calculated for each frame by comparing the subband transient energy in each subband of the frame, or potion of that frame, to a relative energy threshold value, and summing the number of subbands that pass that relative energy threshold value. A transient may be present in a frame where the number of subbands passing the relative energy threshold is greater than a predetermined fraction of the total subbands under analysis for that frame. For example, a transient may be present in a frame where the number of subbands passing the relative energy threshold is greater than a quarter of the total subbands under analysis for that frame.

The method continues by calculating a dynamic gain weighting factor based on the number of subbands passing the threshold for the total number of subbands under analysis. The dynamic gain factors are weighted for each frame according to the weighting factor. The previous dynamic gain for the frame may be reduced to a value of 1 using an exponential decay curve if no transients are detected for the frame. Before applying final dynamic gain to the input signal, a check for tone-like audio may be made to avoid audible modulation of strong tones present in the input signal. If a strong tone is detected within a subband, no additional gain is applied to that subband for that frame period and the dynamic gain for that subband continues to decay based on dynamic gain values of previous frames.

According to another aspect of the present invention, an audio signal processing apparatus is provided. The audio signal processing apparatus comprising: a receiving component for receiving at least one audio signal, each audio signal having at least one channel, each channel being segmented into a plurality of frames over a series of time; a calculating component for calculating at least one measure of dynamic excursion of the audio signal for a plurality of successive segments of time; a filtering component for filtering the audio signal into a plurality of subbands, each frame being represented by at least one subband; a deriving component for deriving a dynamic gain from the measure of dynamic excursion and analyzing at least one subband of the frame to determine if a transient exists in the frame; and applying the dynamic gain to each frame having the transient.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the presently preferred embodiment of the invention, and is not intended to represent the only form in which the present invention may be constructed or utilized. The description sets forth the functions and the sequence of steps for developing and operating the invention in connection with the illustrated embodiment. It is to be understood, however, that the same or equivalent functions and sequences may be accomplished by different embodiments that are also intended to be encompassed within the spirit and scope of the invention. It is further understood that the use of relational terms such as first and second, and the like are used solely to distinguish one from another entity without necessarily requiring or implying any actual such relationship or order between such entities.

An object of the present invention addresses deleterious recording techniques where audio recordings are mastered to be as loud as possible using aggressive applications of dynamic range compression algorithms. The dynamic excursions of transients in those recording signals are much lower than they should be. This yields a perception of a muted, dull or lifeless reproduction when listening at moderate levels.

The present invention analyzes the dynamics of audio recordings and enhances the transients that show evidence of deleterious mastering practices. The present invention is designed using smart/adaptive processing driven by analysis of the loudness and dynamics properties of the source audio recording signal. Modifying the dynamics of the original audio recording signal is avoided unless necessary. However, the default amount of additive dynamics processing can also be adjusted by the user such that the dynamics of any recording can be exaggerated for an even sharper or 'more punchy' sound, or reduced for a more subtle enhancement. The invention could be used to enhance transient dynamics in any music, movie or gaming soundtrack derived from any media source and in any listening environment.

Figure 1A:
FIG. 1a is a perspective view of a waveform of an original audio recording.
Figure 1B:
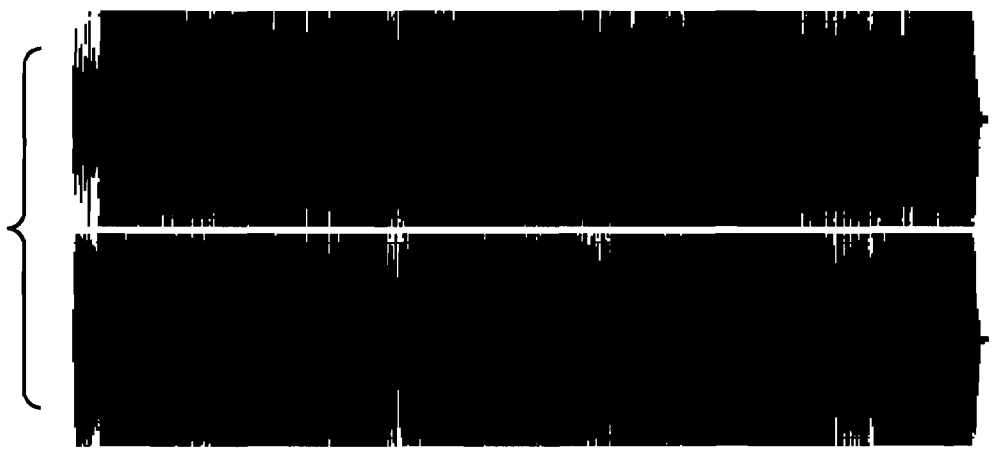
FIG. 1b is a perspective view of a waveform of a remastered audio recording where the dynamic range has been overly compressed.
Figure 2:
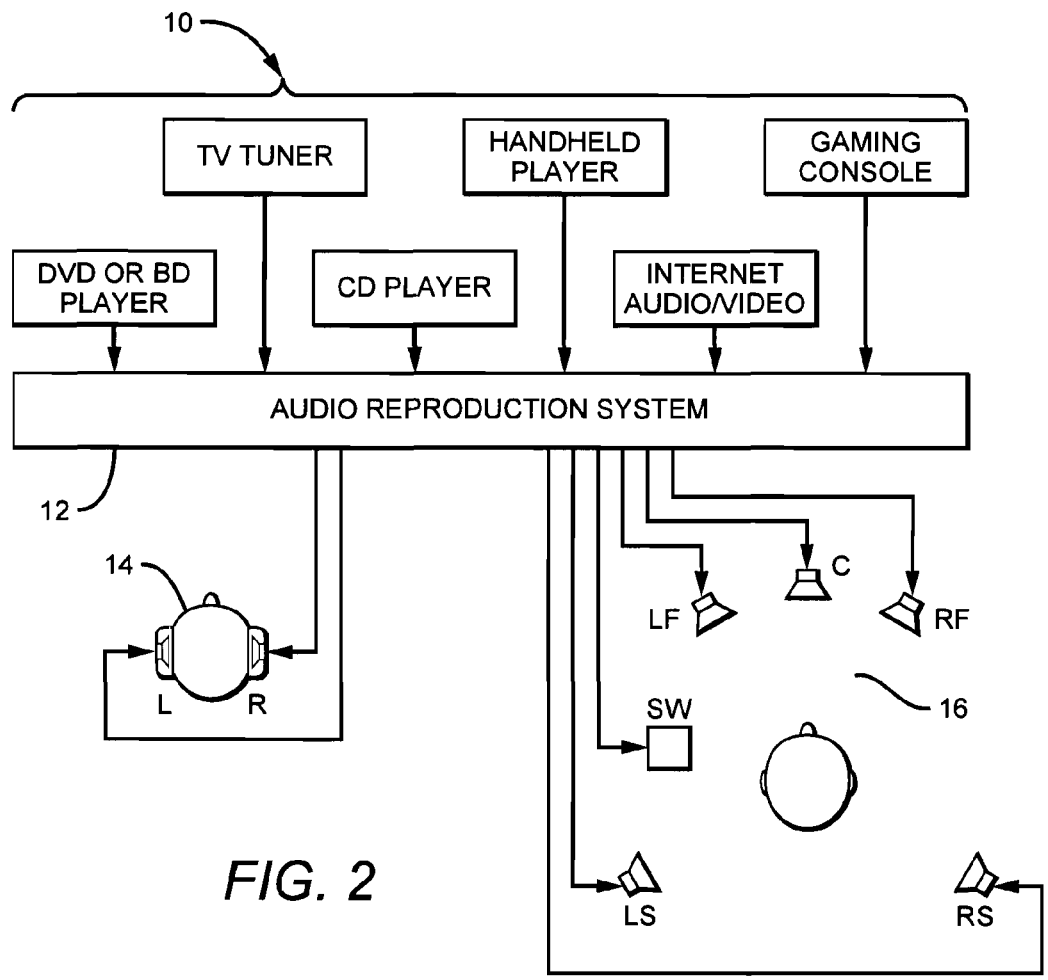
FIG. 2 is a schematic view of a listening environment employing adaptive dynamic enhancement for playback over multi channel loudspeakers or headphones in accordance with an embodiment of the present invention.

Now referring to FIG. 2, a schematic diagram depicting the implementation of multiple embodiments is provided. FIG. 2 depicts an audio listening environment for playback of dynamically enhanced audio recordings over loudspeakers or headphones. The audio listening environment includes at least one consumer electronics device 10, such as a DVD or BD player, TV tuner, CD player, handheld player, Internet audio/video device, a gaming console, or the like. The consumer electronic device 10 provides a source audio recording that is dynamically enhanced to compensate for any deleterious mastering techniques.

In the present embodiment, the consumer electronic device 10 is connected to an audio reproduction system 12. The audio reproduction system 12 processes the audio recording through adaptive dynamic enhancement processing (ADE), which dynamically enhances the audio recording. In an alternative embodiment, a standalone consumer electronic device 10 may enhance the audio recording through ADE processing.

The audio reproduction system unit 12 includes a Central Processing Unit (CPU), which may represent one or more conventional types of such processors, such as an IBM PowerPC, Intel Pentium (x86) processors, and so forth. A Random Access Memory (RAM) temporarily stores results of the data processing operations performed by the CPU, and is interconnected thereto typically via a dedicated memory channel. The audio reproduction system 12 may also include permanent storage devices such as a hard drive, which are also in communication with the CPU over an i/o bus. Other types of storage devices such as tape drives, optical disk drives may also be connected. A graphics card is also connected to the CPU via a video bus, and transmits signals representative of display data to the display monitor. External peripheral data input devices, such as a keyboard or a mouse, may be connected to the audio reproduction system over a USB port. A USB controller translates data and instructions to and from the CPU for external peripherals connected to the USB port. Additional devices such as printers, microphones, speakers, and the like may be connected to the audio reproduction system 12.

The audio reproduction system 12 may utilize an operating system having a graphical user interface (GUI), such as WINDOWS from Microsoft Corporation of Redmond, Wash., MAC OS from Apple, Inc. of Cupertino, Calif., various versions of UNIX with the X-Windows windowing system, and so forth. The audio reproduction system 12 executes one or more computer programs. Generally, the operating system and the computer programs are tangibly embodied in a computer-readable medium, e.g. one or more of the fixed and/or removable data storage devices including the hard drive. Both the operating system and the computer programs may be loaded from the aforementioned data storage devices into the RAM for execution by the CPU. The computer programs may comprise instructions which, when read and executed by the CPU, cause the same to perform the steps to execute the steps or features of the present invention.

The foregoing audio reproduction system 12 represents only one exemplary apparatus suitable for implementing aspects of the present invention. The audio reproduction system 12 may have many different configurations and architectures. Any such configuration or architecture may be readily substituted without departing from the scope of the present invention. A person having ordinary skill in the art will recognize the above described sequences are the most commonly utilized in computer-readable mediums, but there are other existing sequences that may be substituted without departing from the scope of the present invention.

Elements of one embodiment of ADE processing may be implemented by hardware, firmware, software or any combination thereof. When implemented as hardware, the ADE processing may be employed on one audio signal processor or distributed amongst various processing components. When implemented in software, the elements of an embodiment of the present invention are essentially the code segments to perform the necessary tasks. The software preferably includes the actual code to carry out the operations described in one embodiment of the invention, or code that emulates or simulates the operations. The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable medium include an electronic circuit, a semiconductor memory device, a read only memory (ROM), a flash memory, an erasable ROM (EROM), a floppy diskette, a compact disk (CD) ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include data that, when accessed by a machine, cause the machine to perform the operation described in the following. The term "data" here refers to any type of information that is encoded for machine-readable purposes. Therefore, it may include program, code, data, file, etc.

All or part of an embodiment of the invention may be implemented by software. The software may have several modules coupled to one another. A software module is coupled to another module to receive variables, parameters, arguments, pointers, etc. and/or to generate or pass results, updated variables, pointers, etc. A software module may also be a software driver or interface to interact with the operating system running on the platform. A software module may also be a hardware driver to configure, set up, initialize, send and receive data to and from a hardware device.

One embodiment of the invention may be described as a process which is usually depicted as a flowchart, a flow diagram, a structure diagram, or a block diagram. Although a block diagram may describe the operations as a sequential process, many of the operations can be performed in parallel or concurrently. In addition, the order of the operations may be re-arranged. A process is terminated when its operations are completed. A process may correspond to a method, a program, a procedure, etc. FIG. 2 is a schematic diagram illustrating an audio reproduction system 12 for reproduction over headphones 14 or loudspeakers 16. The audio reproduction system 12 may receive digital or analog audio source signals from various audio or audio/video sources 10. The audio source signal may be a mono signal, a two-channel signal (such as a music track or TV broadcast), or a multi-channel signal (such as a movie soundtrack). The audio signal may be any perceived or unperceived sound, such as a real world sound, or an engineered sound, and the like.

The audio reproduction system 12 can include analog-to-digital converters for connecting analog audio sources, or digital audio input interfaces. It may include a digital signal processor for processing the audio signals, as well as digital-to-analog converters and signal amplifiers for converting the processed output signals to electrical signals sent to the transducers (headphones 14 or loudspeakers 16). The audio reproduction system 12 may be a home theater receiver or an automotive audio system dedicated to the selection, processing and routing of audio and/or video signals. Alternatively, the audio reproduction system 12 and one or several of the audio signal sources may be incorporated together in a consumer electronics device 10, such as a portable media player, a TV set or a laptop computer. The loudspeakers 16 may also be incorporated in the same appliance, as in the case of a TV set or a laptop computer.

Figure 3:
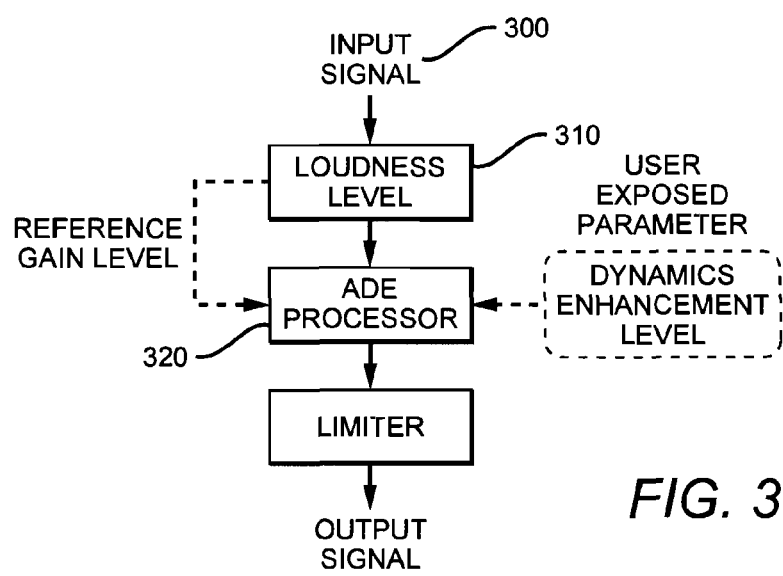
FIG. 3 is a flowchart depicting an optional loudness leveling processing block preceding the adaptive dynamics enhancement processor in accordance with an embodiment of the present invention.

FIG. 3 is a high level flow chart depicting the ADE processing environment. The flow chart initiates at step 300 by receiving an input signal. The input signal is an digital audio signal. In the present embodiment, at step 310, the input signal is processed by a loudness leveling algorithm, whereby the gain of the incoming input signal is adapted over time such that it has a substantially constant average loudness level (say, −20 dB relative to 0 dB full scale). The loudness level algorithm is an optional feature and is not required for implementing ADE processing. Subsequently, at 320, if there is an upstream gain normalization algorithm, ADE processing may factor the reference gain level into available headroom that is required to extend the gain of the incoming signal without causing audible artifacts that may result from signal waveform clipping. This communication is depicted by the dotted arrow. ADE headroom requirements may also factor the input master gain and the gain of the input signal content. The amount of dynamics enhancement applied can be scaled using the user parameter described by DYNAMICS ENHANCEMENT LEVEL. The output limiter is used to ensure that no output saturation takes place as a result of applying the required dynamic EQ to the input signal.

Figure 4:
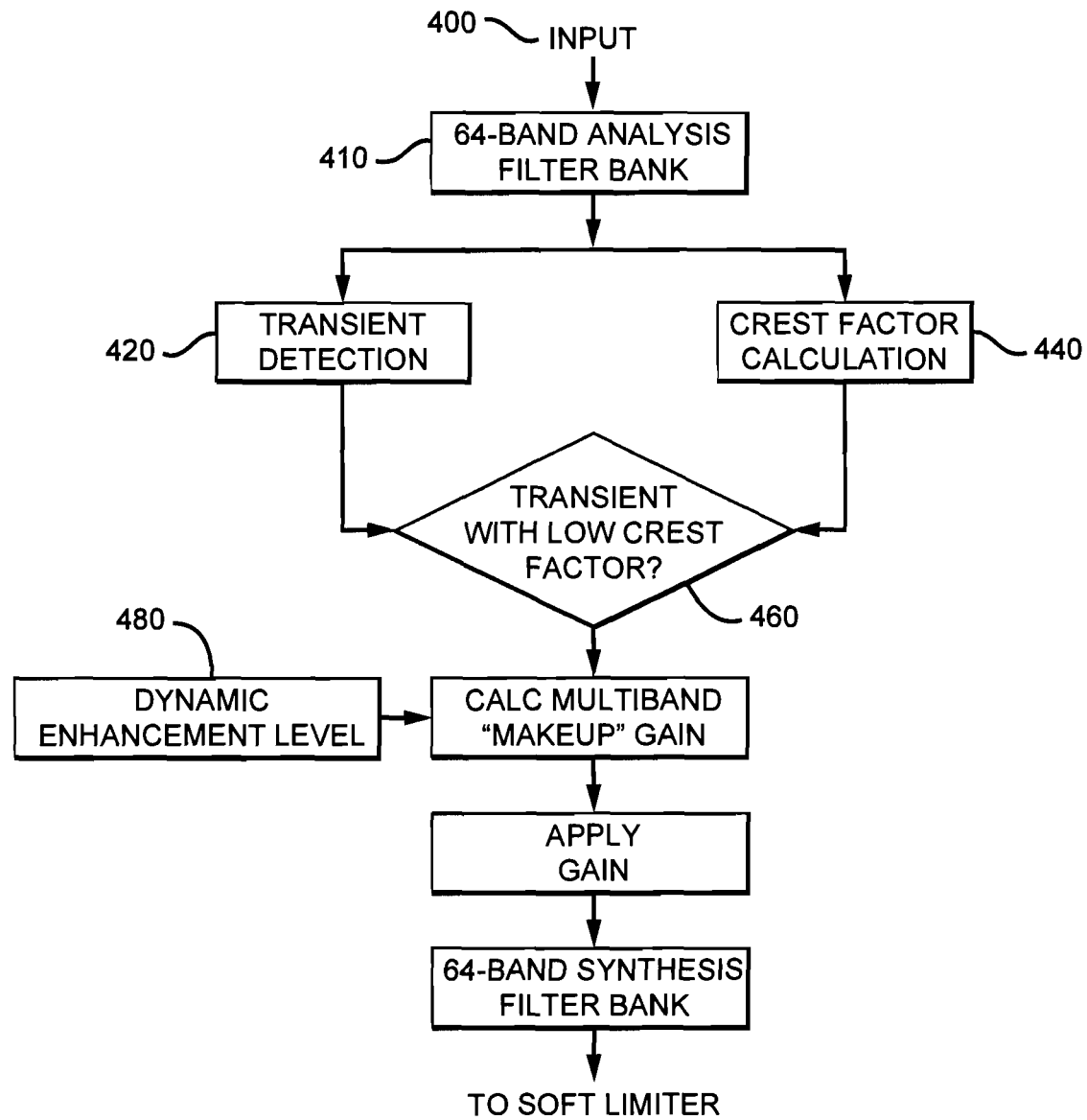
FIG. 4 is a flowchart depicting the steps taken during adaptive dynamic enhancement processing to detect a transient and accordingly apply a gain in accordance with one embodiment of the present invention.

Now referring to FIG. 4, a flowchart depicting one embodiment of ADE processing is depicted. ADE processing is initiated at step 400 by receiving an input signal representing an audio recording. The input signal is a digital audio signal of at least one channel. The input signal represents a tangible physical phenomenon, specifically a sound, which has been converted into an electronic signal, converted to a digital format by Analog/Digital conversion, and suitably pre-processed. Typically, analog filtering, digital filtering, and other pre-processes would be applied to minimize aliasing, saturation, or other signal processing errors downstream, as is known in the art. The audio signal may be represented by a conventional linear method such as PCM coding. At step 410, the input signal is filtered by a multi-tap, multi-band, analysis filter bank, which may suitably be a bank of complementary quadrature mirror filters. Alternatively pseudo quadrature mirror filters (PQMF) such as polyphase filter banks could be used. The filter bank produces a plurality of subband signal outputs. In the present embodiment, 64 of such subband outputs are employed. However, a person skilled in the art will readily recognize that the input signal may be filtered into any number of subbands. As part of the filtering function, filter bank should preferably also critically decimate the subband signals in each subband, specifically decimating each subband signal to a lesser number of samples/second, just sufficient to fully represent the signal in each subband ("critical sampling"). This subband sampling may also mimic the physiology of human hearing.

Subsequent to filtering, the subbands are analyzed for transient detection at step 420. It is contemplated that not all subbands are analyzed for transients, as it may be known that certain frequencies have a lower likelihood of having transients. In the present embodiment, transients are detected using a transient detection algorithm that calculates a weighted sum of energies across frequency bands. Since the energy of the signal usually dominates the lower frequencies, the additional weighting is used to emphasize the energy of the signal where transients are more noticeable. This decreases the possibility of 'false positives' during the identification of transients:

$$TE_{HF}(m, c) = \sum_{k=0}^{N-1} w(k)|G(k, m, c)|^2, \quad (1)$$

where $TE_{HF}(m,c)$ is the instantaneous, high-frequency weighted, transient energy, k is the frequency band index, m is the analysis frame index, c represents the channel index, w(k) corresponds to the k-th frequency weighting filter coefficient and. |G(k,m,c)| represents the absolute gain of the k-th band of the m-th analysis frame of the c-th channel. A person skilled in the art will understand that various transient detection algorithms may be applied in accordance to the present invention and the above the example is provided by way of example and should not be construed as limiting the scope of the invention.

The instantaneous transient energy function is compared to a time average of previous transient energies. This comparison will indicate a likely transient event wherein the instantaneous transient energy should be much greater than the average transient energy. The average transience energy, $TE_{av}$, may be calculated by applying a leaky integrator filter in each frequency band:

$$TE_{av}(m,c)(1-\alpha_{TE})TE_{av}(m-1,c)+\alpha_{TE}TE_{HF}(m,c), \quad (2)$$

where $\alpha_{TE}$ corresponds to the transience energy damping factor, m represents the frame index and c represents the channel index A transient onset is triggered if $$\frac{TE_{HF}(m, c)}{TE_{av}(m, c)} > G_{TRANS},$$

where $G_{TRANS}$ corresponds to some predetermined transience threshold value. Typically, values of $G_{TRANS}$ between 2 and 3 yield good results, but threshold values can also change depending on the source material. Subsequently, at step 440, a multiband crest factor value, CF(k,m,c), is calculated by taking the ratio of the peak signal levels to a time average of previous signal levels within each of the 64 analysis bands.

$$CF(k, m, c) = \frac{G_{peak}(k, m, c)}{G_{av}(k, m, c)} \quad (3)$$

Both the peak signal level and the average signal level are derived using leaky integrators having different attack and release time constants. Alternative methods of calculating average signal levels include averaging across several 'frames' of past frequency subbands stored in system memory. The peak and average gain computations in this embodiment use leaky integrator filters.

$$G_{peak}(k,m,c) = (1-\alpha_{peak\_att})G_{peak}(k,m-1,c) + \alpha_{peak\_att}G(k,m,c)$$

if $G(k,m,c) > G_{peak}(k,m-1,c)$ (4)

$$G_{peak}(k,m,c) = (1-\alpha_{peak\_rel})G_{peak}(k,m-1,c) + \alpha_{peak\_rel}G(k,m,c)$$

if $G(k,m,c) \leq G_{peak}(k,m-1,c)$ (5)

$$G_{av}(k,m,c) = (1-\alpha_{av})G_{av}(k,m-1,c) + \alpha_{av}G(k,m,c) \quad (6)$$

The derived crest factor is based on a ratio of gains. As a result, the derived crest factor is independent of the level of the input signal. Thus, the results are the same regardless of the master gain of the system or the recording level of the original recording. Looking at eq. (3), distinctive transients, such as percussion hits, should have a higher crest factor value than more steady state or tone-like signals. If a signal contains a transient onset that exhibits contrary crest factor values, this is a strong indicator of post-recording dynamic range compression or limiting at that frequency band. In this case, it is likely that the original signal could benefit from a short-time gain boost to yield an expected crest factor value, where short-time refers to onset and decay time on the order of the onset and decay time of the of the detected transient.

As a result, ADE processing assesses the crest factor whenever a transient onset is detected. At step 460, the crest factor is assessed and if it is lower than a target crest factor threshold (determined through a combination of algorithm tuning and/or user preference), the gain in that subband is increased such that the desired crest factor value is attained. This gain may be limited to remain within a prescribed or dynamically assessed headroom budget:

$$G_{eq}(k, m, c) = \quad (7)$$
$$\min\left(G_{eq\_max}, (1-\alpha_{attack})G_{eq}(k, m-1, c) + \alpha_{attack}\frac{CF_{target}}{CF(k, m, c)}\right)$$

if $\frac{CF_{Target}}{CF(k, m, c)} < 1$ and $TE_{HF}(m, c) > G_{TRANS}TE_{av}(m, c)$ where, $G_{eq}(k,m,c)$ represents the applied gain function, $G_{eq\_max}$ represents the maximum allowable gain (usually corresponding to the allotted algorithm headroom), $\alpha_{attack}$ is a gain attack damping function which may be tuned to some value close to 1 if artifacts are discovered resulting from rapid gain changes. The value of this damping function could be frequency dependent to allow gain ramping to occur at different rates for different frequency ranges. $CF_{Target}$ represents the target crest factor value and $CF(k,m,c)$ represents the measured crest factor value at frequency k and frame m and channel c.

If a transient onset is not detected or if the crest factor is greater than or equal to the target crest factor value the applied dynamic EQ gain falls back towards a value of 1 using an envelope that mimics a the dynamics of a typical transient hit. The rate of gain reduction is weighted such that higher frequency gains reduce faster than lower frequency gains:

$$G_{eq}(k,m,c) = \max(1, \alpha_{decay}(k,m)G_{eq}(k,m-1,c)) \quad (8)$$

where $\alpha_{decay}(k.m)$ represents a frequency dependent decay damping factor. In the current embodiment, $\alpha_{decay}(k.m)$ is represented by a 64-point function that ramps exponentially across frequency from a higher to a lower value with boundaries of 1 and 0.

At step 480, the user parameter represented by the 'Dynamics Enhancement Level' (DEL) scales the target crest factor by a value between 0.0 and 1.0. A DEL value of 0.0 implies that the crest factor threshold will always be attained, and therefore no enhancements will be made on the original signal. A DEL value of 0.5 represents the default analysis threshold and represents a 'reasonable' crest factor expectation. With this value, signals that have been compressed are enhanced, while signals with sufficient dynamics will receive little or no dynamics enhancement. A DEL value of 1.0 represents more than a 'reasonable' crest factor expectation, such that the dynamics of most transients will be enhanced whether or not they need it.

The output is derived by multiplying the subband input signal components with a time-varying EQ curve that is derived from the enhancement gains. These gains are smoothed across frequency to avoid artifacts. The EQ curve is applied to the original complex input signal data and the resulting complex band coefficients are then recombined and transformed to a time domain output sample block using a 64-band synthesis bank or equivalent frequency-to-time domain filter. Finally, the time-domain output of the synthesis filter band is passed through a soft limiter (or equivalent) to counteract any occasional level overshoots that may have been caused by signal level increases that were beyond the available headroom.

This input/output process is repeated for each analysis frame. The gain of the EQ curve dynamically changes according to the analysis of each frame. In the embodiment described above, the derived gain curve was applied to the original signal by multiplication in the frequency domain followed by an output synthesis that is complementary to the input synthesis block. In other embodiments, the analysis and synthesis methods may differ. For example, the analysis could take place in the frequency domain, as described above, and once the desired gain curve has been calculated, a filter representing that desired frequency response could be implemented in the time domain using FIR and/or IIR filters. The coefficients of the time domain filters would change according to the analysis of each input data frame. Alternatively, the analysis of crest factors and transient onset detection could also take place in the time domain in its entirety.

The analysis and synthesis described above uses evenly spaced frequency bands. It is preferred to perform the analysis over logarithmically spaced bands that better match the psychoacoustics of human hearing.

Figure 5:
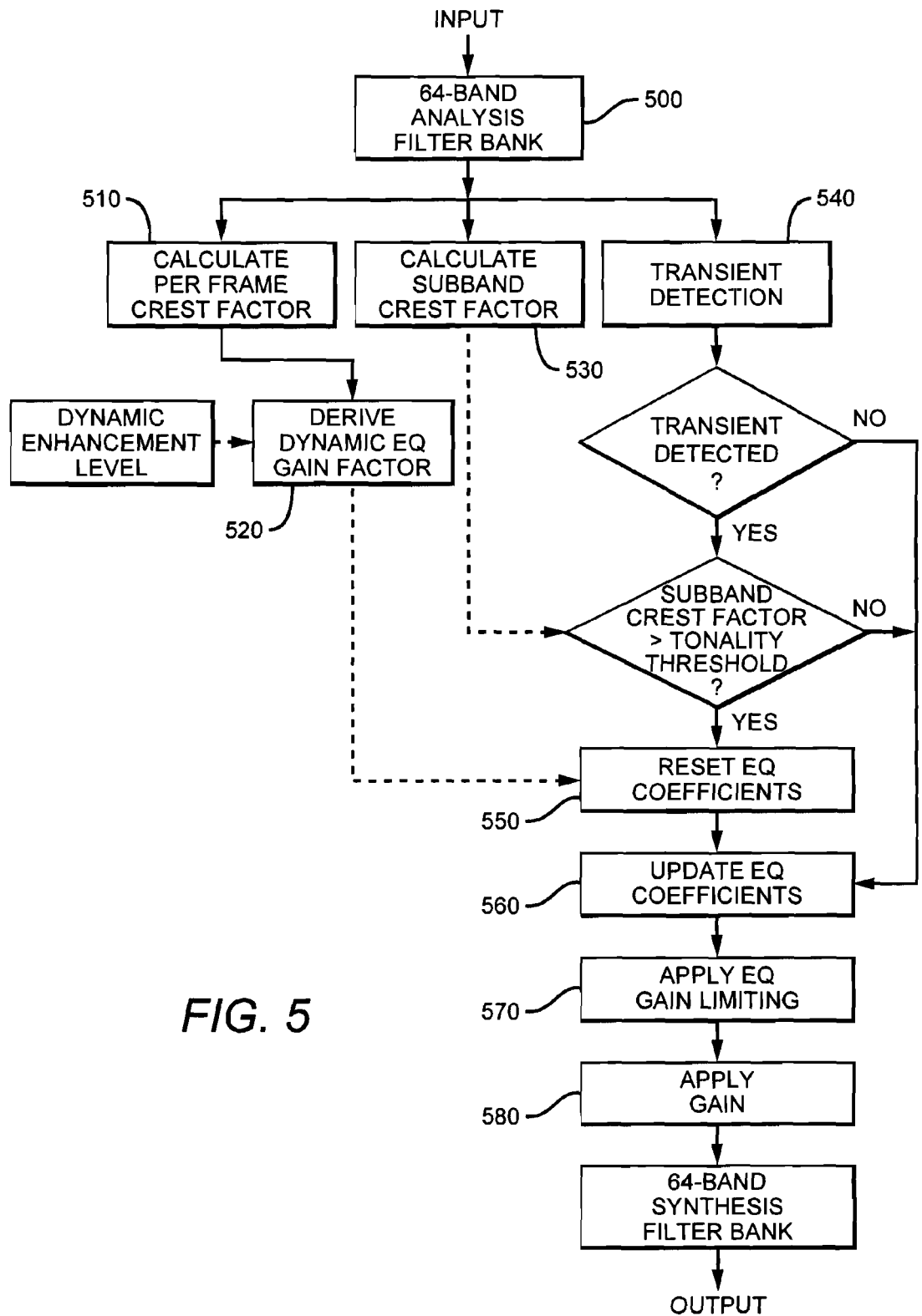
FIG. 5 is a flowchart depicting the steps taken during adaptive dynamic enhancement processing to detect a transient, assess the transient against a known threshold, and accordingly apply an adaptive EQ curve in accordance with one embodiment of the present invention

Now referring to FIG. 5, a flowchart depicting a preferred embodiment of ADE processing is presented. The flow chart initiates, at step 500, by converting input signals into a complex frequency domain representation using 64-band oversampled polyphase analysis filter banks. Other types of filter banks could be used. A different number of filter banks could also be used. In the implementation described here, the analysis filter bank extracts a block of 64 frequency domain samples for each block of 64 time domain input samples, to form subband audio signals.

At step 510, a frequency independent per-frame crest factor is derived for each channel, in order to assess the amount of dynamics present in the input signal.

Where $H_{sum}(m,c)$ is defined as the sum of k frequency band magnitudes for the mth frame of the cth channel of input data:

$$H_{sum}(m,c) = \Sigma H(k,m,c)$$

A peak sum function is defined as $$H_{sum\_pk}(m,c) = H_{sum}(m,c)) \text{ if } H_{sum}(m,c) > H_{sum\_pk}(m-1,c)$$

otherwise, $$H_{sum\_pk}(m) = (1-\alpha_{pk\_rel})H_{sum\_pk}(m-1) + \alpha_{pk\_rel}H_{sum}(m)$$

The average sum function is defined by the leaky integrator function:

$$H_{sum\_av}(m,c) = (1-\alpha_{avg})H_{sum\_av}(m-1,c) + \alpha_{avg}H_{sum}(m,c)$$

where $\alpha_{pk\_rel}$ represents the peak release coefficient and $\alpha_{avg}$ represents the average smoothing coefficient.

The per-frame crest factor is defined as the ratio of the peak signal magnitude to average signal magnitude, $$CF(m,c) = \frac{H_{sum\_pk}(m,c)}{H_{sum\_av}(m,c)}$$

where CF(m) represents the crest factor of the $m^{th}$ frame of the $c^{th}$ channel of input data. It is contemplated that the crest factor may be described in terms of energy summation.

$$H_{sum}(m,c) = \Sigma |H(k,m,c)|^2$$

The per-frame crest factor indicates the amount of dynamic range present in the input signal. This crest factor should be greater than or equal to some expected target value when a transient is detected. If the per-frame crest factor is too low in the presence of a transient, a short-term gain is applied to the input signal frame to increase the measured crest factor to a more-expected value, where short-time here refers to onset and decay time on the order of the onset and decay time of the of the detected transient.

At step 520, a per-frame dynamic gain, $G_{DYN}(m,c)$ is derived by taking the ratio of the a prescribed target crest factor, $CF_T$ and the measured crest factor CF(m,c) represents the amount of gain required to attain the desired level of dynamic excursion.

$$G_{DYN}(m,c) = \frac{CF_T}{CF(m,c)}$$

The value of $CF_T$ is assumed to represent a reasonable crest factor for dynamic material, 14 dB for example. This prescribed target crest factor could also be modified by a user controllable gain called the Dynamic Enhancement Level (DEL) thereby indirectly affecting the amount of enhancement applied.

$$G_{DYN}(m,c) = \frac{[DEL * CF_T]}{CF(m,c)}$$

If the target crest factor is greater than the measured crest factor, $G_{DYN}(m,c)$ will be less than 1. If this gain value were allowed, it would ultimately lead to a decrease in the level of transient events in the input. However, in the present embodiment $G_{DYN}(m,c)$ is limited to be greater or equal to 1.

$$G_{DYN}(m,c) = \max\left(1, \frac{[DEL * CF_T]}{CF(m,c)}\right)$$

The $G_{DYN}(m,c)$ is not applied to the input signal at this stage. But rather, it is only applied if two other conditions are met:
1. A transient has been detected for the current frame; or
2. The subbands to which the gain is applied do not have any strong tonal content.

At step 540, transients in the current frame are detected. The subband signals are analyzed to detect transients using a transient detection algorithm that calculates a per subband relative energy function. The value of this function will increase sharply when a large increase in energy is detected within a subband. The presence of more subbands indicates a simultaneous increase, which further indicates a higher likelihood that a transient has been detected within a given frame. The relative energy function may be defined as:

$$RE(k,m,c) = \frac{E_{inst}(k,m,c)}{E_{av}(k,m,c)} \quad (1)$$

where $E_{inst}(k,m,c)$ represents the energy measured at the $k^{th}$ subband of the $m^{th}$ frame of the $c^{th}$ channel and $E_{av}(k,m,c)$ represents the averaged energy measured at the $k^{th}$ subband of the $m^{th}$ frame of the $c^{th}$ channel. The per-subband averaging is based on a leaky integration function:

$$E_{av}(k,m,c) = (1-\epsilon_{av})E_{av}(k,m-1,c) + \epsilon_{av}E_{inst}(k,m,c)$$

For each subband relative energy function, the current value is compared to some relative energy threshold value, $RE_{TRESH}$. If the relative energy function threshold is exceeded in a subband, that subband is tagged as having an energy increase that is indicative of a transient. An overall per-frame transient energy function is then calculated by summing the number of subbands that pass the relative energy threshold:

$$TE(m,c) = \Sigma(RE(k,m,c) > RE_{TRESH})$$

Here, TE(m,c) is an integer value between 0 and K where K represent that total number of subbands used for analysis. Note that K can be less than the total number of bands in the frame. For example, it may be more desirable to focus transience detection on subbands bands in which significant energy has been detected.

A significant proportion of subbands surpassing the relative energy threshold is indicative of a broadband increase of energy that is representative of a transient. However, it is difficult to correlate an exact number of subbands with positive results to specifically define a transient. In some circumstances, the average signal level may be so high that the relative energy threshold may remain low in many bands. While the required number of subbands with positive results to account for this may be lowered, this may lead to a 'false-positive' transient detection. Therefore, the per-frame transient energy function is thresholded to derive an estimate of the likelihood of a transient. Further, a series of gain weighting functions are calculated that are proportional to the number of subbands in which $RE_{TRESH}$ is exceeded. For example, $$W_T(m,c)=1 \text{ if } TE(m,c)>K/2$$

$$W_T(m,c)=0.75 \text{ if } TE(m,c)>K/3$$

$$W_T(m,c)=0.5 \text{ if } TE(m,c)>K/4;$$

where K represents the total number of subbands under analysis.

Otherwise, $$W_T(m,c)=0$$

Other values could be used for the positive subband thresholds and the associated weighting gains. At step 550, it is determined that any value of $W_T(m,c)>0$ on either input channel represents a transient onset. The dynamic gain is then modified by the weighting factor:

$$G_{DYN\_MOD}(m,c)=\max(1,G_{DYN}(m,c)*W_T(m,c))$$

The boundary check is applied to ensure a gain less than 1 is not applied. This gain can them be applied to all subbands of the current data frame. However, this may not be desired in subbands that have significant tone-like components as a sudden increase in gain in these bands may result in audible signal modulation. To avoid this scenario, each subband is analyzed for the presence of strong tones. By their nature, tone-like components have relatively low peak-to-average ratios (or subband crest factors). Therefore, there are no additional gains applied to subbands having measured crest-factors that are below a so called tonality threshold and they continue to decay based on their original decay trajectory.

At step 530, a per subband crest factor value is calculated by taking the ratio of the peak gain levels to a time averaged gain within each of the analysis bands.

$$CF(k,m,c) = \frac{G_{peak}(k,m,c)}{G_{av}(k,m,c)}$$

Both the peak and the average filters are implemented using leaky integrators.

$$G_{peak}(k,m,c)=G(k,m,c) \text{ if } G(k,m,c)>G_{peak}(k,m-1,c)$$

where $G(k,m,c)$ represents the magnitude of the $k^{th}$ subband of the $m^{th}$ frame of the $c^{th}$ channel. Otherwise, $$G_{peak}(k,m,c)=(1-\beta_{peak\_rel})G_{peak}(k,m-1,c)+\beta_{peak\_rel}G(k,m,c))$$

$$G_{av}(k,m,c)=(1-\beta_{av})G_{av}(k,m-1,c)+\beta_{av}G(k,m,c))$$

where $\beta_{peak\_rel}$ represents the per-subband peak release function and $\beta_{av}$ represents the average smoothing function.

In frames where a transient onset is detected, the per subband crest factor is compared to a predefined threshold, $\gamma_{TONE}$, which determines if a tone like component is present in that subband. If the subband crest factor is below this threshold, we assume a tone-like component is detected and no gains are applied to that subband for that frame. Various measures of tonality may be used, such as a coefficient of tonality as described in J. Johnston, "*Transform coding of audio signals using perceptual noise criteria,*" IEEE J Sel. Areas in Comm., vol. 6, no. 2, pp. 314-323, February 1998.

The final per-subband dynamic gains, described as $EQ_{DYN}(k,m,c)$ are instantly updated to a value of:

$$EQ_{DYN}(k,m,c)=G_{DYN\_MOD}(m,c) \text{ if } CF(k,m,c)>\gamma_{TONE}$$

At step 560, it is determined that if no transients are detected or if a tone-like component is detected in a subband, the relevant subband values of $EQ_{DYN}(k,m,c)$ decay towards a value of 1 (no processing) using a frequency dependent exponential curve that models a typical transient decay function:

$$EQ_{DYN}(k,m,c)=\max(EQ_{DYN}(k,m,c)*\sigma_{decay}(k),1)$$

where $\sigma_{decay}(k)$ represents a per-subband decay coefficient function that decreases with increasing frequency to mimic how lower frequency transients decay more slowly than high frequency transients. The boundary check is applied to ensure a gain less than 1 is not applied.

At step 570, $EQ_{DYN}(k,m,c)$ is constrained within a limited range to avoid output saturation, as follows:

If $EQ_{DYN}(k,m,c)*|X(k,m,c)| > Y_{max}$ $$EQ_{DYN}(k,m,c) = EQ_{DYN}(k,m,c)\frac{Y_{max}}{|X(k,m,c)|}$$

where $|X(k,m,c)|$ represents the magnitude of the input data for the $k^{th}$ bin of the $m^{th}$ frame of the $c^{th}$ channel and $Y_{max}$ represents the maximum allowed output value for every subband of every frame of every channel. The final version of $EQ_{DYN}(k,m,c)$ can be smoothed across frequency to avoid artifacts, if warranted.

At step 580, the prescribed enhancement is applied to the appropriate input channel by multiplying the complex input coefficients in each band with $EQ_{DYN}(k,m,c)$.

$$Y(k,m,c)=EQ_{DYN}(k,m,c)X(k,m,c)$$

where $X(k,m,c)$ represents the input data for the $k^{th}$ bin of the $m^{th}$ frame of the $c^{th}$ channel and $Y(k,m,c)$ represents the output data for the $k^{th}$ bin of the $M^{th}$ frame of the $c^{th}$ channel.

The resulting complex band coefficients are recombined and transformed to a time domain output sample block using a 64-band synthesis bank or equivalent frequency-to-time domain filter.

The input/output processes described above (steps 500-s580) are repeated for each input sample block. The gain of the EQ curve will change dynamically according to the analysis of each input signal block.

The gain of the EQ curve dynamically changes according to the analysis of each input signal frame. In the embodiment described above, the derived gain curve is applied to the original signal by multiplication in the frequency domain followed by an output synthesis that is complementary to the input synthesis block. In other embodiments, the analysis and synthesis method may be different.

The analysis and synthesis described above employs evenly spaced frequency bands. However, it is preferred to perform the analysis over logarithmically spaced bands that better match the psychoacoustics of human hearing.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show particulars of the present invention in more detail than is necessary for the fundamental understanding of the present invention, the description taken with the drawings making apparent to those skilled in the art how the several forms of the present invention may be embodied in practice.

What is claimed is:

1. A method for conditioning an audio signal, comprising the steps of:
   receiving at least one audio signal, each audio signal having at least one channel, each channel being segmented into a plurality of frames over a series of time;
   calculating a long term dynamic behavior of the audio signal over at least one of the frames;
   comparing the long term dynamic behavior to a predetermined target value;
   filtering the audio signal into a plurality of subbands, each frame being represented by at least one subband;
   measuring at least one short term dynamic behavior in each of the subbands;
   analyzing the short term dynamic behavior of the frame to determine if a transient exists in the frame;
   deriving a dynamic gain based on each measure of short term and long term dynamic behavior;
   detecting a transient in the frame and, after the transient has been detected, then comparing a crest factor to a target crest factor threshold; and
   determining that the crest factor is lower than the target crest factor threshold and then increasing the dynamic gain to each subband having transients to attain a desired crest factor value.

2. The method of claim 1, wherein the crest factors are calculated by taking ratios of functions of peak signal magnitudes to functions of average signal magnitudes of the audio signal within the frame.

3. The method of claim 2, wherein the crest factor is calculated for each subband by determining the ratio of peak gain levels to a time averaged gain, represented as:

$$CF(k, m, c) = \frac{G_{peak}(k, m, c)}{G_{av}(k, m, c)};$$

wherein:
   CF=the crest factor value at a $k^{th}$ subband of a $m^{th}$ frame of a $c^{th}$ channel;
   $G_{peak}$=peak gain levels at the $k^{th}$ subband of the $m^{th}$ frame of the $c^{th}$ channel;
   $G_{av}$=time averaged gain at the $k^{th}$ subband of the $m^{th}$ frame of the $c^{th}$ channel.

4. The method of claim 3, wherein the subband crest factor is compared to a predefined tonality threshold, and if the subband crest factor is below the predefined tonality threshold the subband gain is not further modified.

5. The method of claim 1, wherein the analyzing step further includes:
   calculating a subband relative energy function for at least one subband, represented as:

$$RE(k, m, c) = \frac{E_{inst}(k, m, c)}{E_{av}(k, m, c)};$$

wherein:
   RE(k,m,c)=the subband relative energy measured at a $k^{th}$ subband of a $m^{th}$ frame of a $c^{th}$ channel;
   $E_{inst}(k,m,c)$, an instantaneous energy measured at the $k^{th}$ subband of the $m^{th}$ frame of the $c^{th}$ channel; and
   $E_{av}(k,m,c)$=represents an averaged energy measured at the $k^{th}$ subband of the $m^{th}$ frame of the $c^{th}$ channel.

6. The method of claim 5, wherein an overall transient energy is calculated for each frame by comparing the subband relative energy in each subband of the frame to a threshold value, and summing the number of subbands that pass the threshold value, represented as:

$$TE(m,c)=\Sigma(RE(k,m,c)>RE_{TRESH})$$

wherein;
   TE(m, c)=the overall transient energy measured at the $m^{th}$ frame of the $c^{th}$ channel;
   RE(k,m,c)=the subband relative energy measured at the $k^{th}$ subband of the $m^{th}$ frame of the $c^{th}$ channel; and
   $RE_{thresh}$=the threshold relative energy value.

7. The method of claim 6, wherein the transient is present in the frame when the number of subbands passing the threshold is greater than a predetermined fraction of the total subbands under analysis for that frame.

8. The method of claim 6, further including the steps of:
   calculating a series of gain weighting functions that are proportional to the number of subbands in which $RE_{thresh}$ is exceeded;
   calculating weighting factors based on the series of gain weighting functions; and
   weighting the dynamic gain for each frame based on the weighting factors.

9. The method of claim 1, wherein the applied dynamic gain is reduced using an exponential decay curve if no transients are detected for the frame.

10. The method of claim 9, wherein the exponential decay curve is frequency dependent.

11. The method of claim 9, wherein lower frequencies decay slower than higher frequencies.

12. The method of claim 1, wherein the applied dynamic gain is reduced using a tonality exponential decay curve if tonal components are detected for each subband having subband crest factors below a predefined tonality threshold.

13. An audio signal apparatus comprising:
   a receiving component for receiving at least one audio signal, each audio signal having at least one channel, each channel being segmented into a plurality of frames over a series of time;
   a calculating component for calculating a long term dynamic behavior of the audio signal over at least one of the frames, wherein the long term dynamic behavior is compared to a predetermined target value;
   a filtering component for filtering the audio signal into a plurality of subbands, each frame being represented by at least one subband;
   a measuring component for measuring at least one short term dynamic behavior in each of the subbands;
   an analyzing component for analyzing the short term dynamic behavior of a frame to determine if a transient exists in the frame; and
   a deriving component for deriving a dynamic gain based on each measure of short term and long term dynamic behavior;
   a comparing component for comparing a crest factor of the frame to a target crest factor threshold after a transient has been detected in the frame;
   a determining component for detecting that the crest factor of the frame is below the target crest factor threshold; and
   an increasing component for increasing the dynamic gain to each subband having transients for a short period of time to increase the crest factor of the frame to a target crest factor, wherein the short period of time means that onset and decay times of the dynamic gain are on an order of onset and decay times of the detected transient.

14. The method of claim 13, further comprising defining the short-term dynamic gain as a ratio of the target crest factor and the crest factor of the frame, wherein the short-term dynamic gain represents an amount of gain required to attain the target crest factor.

* * * * *